US010328679B2

(12) United States Patent
He (10) Patent No.: US 10,328,679 B2
(45) Date of Patent: Jun. 25, 2019

(54) EQUIPMENT SYSTEM USING ORGANIC SILICONE RESIN PHOTOCONVERTER TO BOND-PACKAGED LED BY TANDEM ROLLING (71) Applicant: Jiangsu Cherrity Optronics Co., Ltd, Jiangning Nanjing (CN)

(72) Inventor: Jinhua He, Jiangning Nanjing (CN)

(73) Assignee: Jiangsu Cherrity Optronics Co., Ltd, Jiangsu (CN)

( * ) Notice: Subject to any disclaimer, the term of this patent is extended or adjusted under 35 U.S.C. 154(b) by 0 days.

(21) Appl. No.: 15/750,317

(22) PCT Filed: Dec. 18, 2015

(86) PCT No.: PCT/CN2015/097902
§ 371 (c)(1),
(2) Date: Feb. 5, 2018

(87) PCT Pub. No.: WO2017/028428
PCT Pub. Date: Feb. 23, 2017

(65) Prior Publication Data
US 2018/0229487 A1  Aug. 16, 2018

(30) Foreign Application Priority Data
Aug. 18, 2015  (CN) .......................... 2015 1 0508190

(51) Int. Cl.
B32B 43/00  (2006.01)
B32B 37/00  (2006.01)
(Continued)

(52) U.S. Cl.
CPC .......... *B32B 37/0053* (2013.01); *B32B 37/08* (2013.01); *B32B 37/203* (2013.01);
(Continued)

(58) Field of Classification Search
CPC . B32B 38/10; B32B 43/006; Y10T 156/1158; Y10T 156/1174;
(Continued)

(56) References Cited

U.S. PATENT DOCUMENTS 7,591,863 B2  9/2009  Watanabe et al.
8,946,734 B2  2/2015  Lo
(Continued)

FOREIGN PATENT DOCUMENTS

DE  102012207777 A1  11/2013
WO  2017028428 A1  2/2017

OTHER PUBLICATIONS

State Intellectual Property Office of the P.R. China, International Search Report for PCT/CN2015/097902, dated May 26, 2016, 4 pp.

*Primary Examiner* — Mark A Osele
*Assistant Examiner* — Nickolas R Harm
(74) *Attorney, Agent, or Firm* — Edwin S. Flores; Chalker Flores, LLP (57) ABSTRACT An equipment system for bond-packaging an LED using an organic silicone resin photoconverter by tandem rolling includes a protective film removing apparatus used for removing a protective film on one side of a photoconversion sheet with protective films on both sides and a roll-bonding apparatus for packaging a flip chip LED array by using the photoconversion sheet containing a protective film on a single side, to form LED package elements. The protective film removing apparatus includes a photoconversion sheet freezing part (2-1, 2-2), a traction part for pulling and removing a protective film on a single side of the frozen photoconversion sheet, and a photoconversion sheet rewarming part (4-1, 4-2) that are sequentially connected and disposed. The roll-bonding apparatus includes two single-wheeled rollers (5-1, 5-2) whose rolling surfaces are both smooth surfaces. The present invention has a significant (Continued)

advantage of bond-packaging an LED by using a continuous rolling process, and can satisfy a requirement of a process for bond-package an LED using an organic silicone resin photoconverter, thereby improving the production efficiency and yield of LED packages in industrialized batch production.

13 Claims, 6 Drawing Sheets (51) Int. Cl.
    *H01L 33/00* (2010.01)
    *H01L 33/48* (2010.01)
    *B32B 37/08* (2006.01)
    *B32B 37/20* (2006.01)
    *B32B 38/00* (2006.01)
    *B32B 38/10* (2006.01)
    *H01L 33/56* (2010.01)

(52) U.S. Cl.
    CPC .......... *B32B 38/0004* (2013.01); *H01L 33/00* (2013.01); *H01L 33/48* (2013.01); *B32B 38/10* (2013.01); *B32B 43/006* (2013.01); *B32B 2457/00* (2013.01); *H01L 33/56* (2013.01); *H01L 2933/005* (2013.01); *Y10T 156/1153* (2015.01); *Y10T 156/1158* (2015.01); *Y10T 156/1174* (2015.01); *Y10T 156/195* (2015.01); *Y10T 156/1911* (2015.01); *Y10T 156/1917* (2015.01); *Y10T 156/1956* (2015.01)

(58) Field of Classification Search
    CPC ......... Y10T 156/1911; Y10T 156/1917; Y10T 156/195; Y10T 156/1956
    USPC ....... 156/254, 504, 711, 712, 715, 752, 753, 156/759, 760
    See application file for complete search history.

(56) References Cited

U.S. PATENT DOCUMENTS

| | | | |
|---|---|---|---|
| 2007/0074822 A1* | 4/2007 | Akechi | ............... B29C 63/0013 156/750 |
| 2009/0199950 A1* | 8/2009 | Kitada | ............... B23K 26/0846 156/64 |
| 2013/0015472 A1 | 1/2013 | Lo | |
| 2015/0171288 A1 | 6/2015 | Matsumara et al. | |

* cited by examiner

EQUIPMENT SYSTEM USING ORGANIC SILICONE RESIN PHOTOCONVERTER TO BOND-PACKAGED LED BY TANDEM ROLLING

CROSS-REFERENCE TO RELATED APPLICATIONS

This application is the National Stage of International Application No. PCT/CN2015/097902, filed on 18 Dec. 2015 claiming the priority of CN 201510508190.2 filed on 18 Aug. 2015, the content of each of which is incorporated by reference herein.

BACKGROUND OF THE INVENTION

Technical Field

The present invention relates to the technical field of LED package equipment, and in particular, to an equipment system for bond-packaging an LED using an organic silicone resin photoconverter by tandem rolling.

Background

With the advantages such as high brightness, low heat, long service life, and being environmentally friendly and renewable, LEDs are known as the most promising new generation of green light sources in the 21st century. At present, the theoretical service life of the LED can be over 100,000 hours. However, during actual application, limited by many factors such as chip failure, package failure, thermal overstress failure, electrical overstress failure, and/or assembly failure, especially limited by the package failure, the LED prematurely encounters luminous decay or loss of luminous efficacy, thus hindering development of the LED to be a novel energy-saving light source. To solve these problems, many scholars in the field have carried out related researches, and have proposed some improvement measures to enhance luminous efficacy and actual service life of the LED. For example, flip-chip LED packaging is developed in recent years. Compared with conventional LED upright packaging, this flip-chip manner has such advantages as high luminous efficacy, high reliability, and easy integration. This manner also greatly saves packaging materials. For example, materials such as a gold wire, die bonding glue, and a support that are used in the conventional LED upright packaging are no longer needed. Further, this manner greatly simplifies a packaging process. For example, die bonding, wire soldering, and even light splitting in the conventional LED upright packaging are no longer needed. In this way, the LED flip-chip packaging is increasingly widely applied. However, it should also be noted that, the existing flip-chip LED packaging technologies mostly bond a photoconverter made of an organic silicone resin to a flip chip LED by using a casting process, a screen printing process, an upper and lower flat plate molding process, a single-wheeled roller pressing process, and the like. These processes and matched packaging equipment cannot desirably solve flaws such as pores and unequal thickness of the photoconverter made of the organic silicone resin, thus causing a low yield of the LEDs packaged by using a photoconverter. In addition, due to low production efficiency, the high product costs cannot be reduced.

Chinese patent application NO. 201010204860.9 discloses a "flip-chip LED packaging method", which includes steps of: (a) coating a surface of an LED chip with a photoconverter through screen printing, and baking the photoconverter to cure the photoconverter; (b) fixing the LED chip on a chip substrate, such that electrodes of the LED chip and electrodes of the chip substrate are bonded; (c) fixing the LED chip and the chip substrate to the bottom of a reflector cup on a support; (d) separately connecting positive and negative electrodes of the fixed chip substrate to positive and negative electrodes of the support by using wires; (e) placing a sealing mold or lens cover on the support on which the LED chip and the chip substrate are fixed, and filling the sealing mold or lens cover with silica gel; and (f) baking a whole structure to cure it. This method uses the screen printing process to enhance uniformity of coating thickness of the photoconverter and enhance distribution uniformity of fluorescent powder particles, so as to improve the yield. However, there exist the following obvious defects: First, after the surface of the LED chip is coated with the photoconverter made of the organic silicone resin through a screen printing process, due to thermal overstress in a subsequent baking and curing procedure, pores still occur in part of the photoconverter coating and the coated surface of the LED chip, thus forming sags and crests. Secondly, after the sealing mode or lens cover is filled with the silica gel and packaged together with the photoconverter-coated LED chip, due to thermal overstress in the subsequent procedure of baking and curing the whole structure, pores still occur in part of the silica gel layer on the sealing mold or lens cover, thus forming sags and crests. Because the thermal overstress impact on the LED chip cannot be resolved in the packaging procedure, LED luminous efficacy is reduced inevitably. Thirdly, no intelligent control system is equipped to control the whole LED chip packaging process, which directly affects improvement of the yield.

Chinese patent application NO. 201310270747.4 discloses an "LED coated with photoconverter layer, manufacturing method for same, and LED device". This solution includes: an LED configuration stage, in which an LED is configured on a surface of a support chip in a through-thickness direction; a layer configuration stage, in which a photoconverter layer is configured on a surface of the support chip in the through-thickness direction in the same manner as LED configuration, the photoconverter layer being formed by active energy ray cured resin which is cured by irradiation with an active energy ray and a fluorescent resin composition of the photoconverter; a curing stage, in which the photoconverter layer is irradiated with an active energy ray to cure the photoconverter layer; a cutting stage, in which the photoconverter layer is cut corresponding to the LED, to obtain an LED coated with the photoconverter layer; and an LED separation stage, in which the LED coated with the photoconverter layer is separated from the support chip after the cutting process. This method aims to offer a solution to uniform configuration of photoconverters around the LED to avoid damage, thus obtaining an LED coated with a photoconverter layer, and an LED device having the LED coated with the photoconverter layer. However, there exist the following obvious defects: First, in a curing procedure of the fluorescent resin composition of the photoconverter, due to thermal overstress, pores still occur in part of the photoconverter surface layer, thus forming sags and crests. Secondly, the LED coated with the photoconverter layer is still affected by the thermal overstress, causing a decrease in luminous efficacy of the LED in use. Thirdly, the stages of the whole packaging process are complicated, causing low production efficiency of LED packages. Fourthly, an upper and lower flat plate molding process may cause displacement of a flip chip, thus inevitably reducing the yield.

Chinese patent application NO. 201380027218.X discloses a "resin sheet laminate, and manufacturing method for semiconductor light-emitting element using same". In this solution, the resin sheet laminate is formed by disposing a fluorophor-containing resin layer on a substrate, where the fluorophor-containing resin layer has multiple regions, the substrate has a lengthwise direction and a transverse direction, and the multiple regions are arranged along the lengthwise direction repeatedly to form columns. By using the resin sheet laminate, this solution aims to enhance uniformity of color and brightness of a semiconductor light-emitting element to which the fluorophor-containing resin layer is attached, and make it easy to manufacture and free to design the element. However, there exist the following obvious defects: First, the used fluorescent resin sheet is a cured fluorescent resin sheet, and therefore, possible residual pores, sags and crests, or other flaws produced during processing cannot be effectively eliminated. Secondly, in a bonding stage, a pressure is exerted by a pressurizing tool from a side of the semiconductor light-emitting element, which may damage the semiconductor light-emitting element. Thirdly, in the bonding stage using an adhesive in the fluorophor-containing resin layer, it is difficult to eliminate residuals from the semiconductor light-emitting element after bonding, and pores easily occur in the bonding procedure, thus reducing the yield; in addition, existence of the bonding layer reduces light emission efficiency of the LED element. Fourthly, the substrate under the fluorescent resin sheet bonded to the light emitting surface of the semiconductor light-emitting element is not removed, which directly affects luminous efficacy of the semiconductor light-emitting element. Fifthly, the multiple regions of the fluorophor-containing resin layer are arranged in the lengthwise direction repeatedly to form columns, but actually it is complex to arrange the multiple regions of the fluorophor-containing resin layer in such a manner, thus affecting the packaging efficiency of the whole element. An error in arrangement positions of the multiple regions directly affects the precision of subsequent bonding with the light-emitting element. If the multiple regions cannot be rendered uniform in size and thickness, a severe problem of product inconsistency may emerge.

In conclusion, nowadays, how to overcome the defects in the prior art is one of major problems that need to be urgently resolved in the technical field of equipment for packaging an LED by using fluorophor.

SUMMARY OF THE INVENTION

An objective of the present invention is to overcome the defects in the prior art and provide an equipment system for bond-packaging an LED using an organic silicone resin photoconverter by rolling. The present invention has a significant advantage of bond-packaging an LED by using a continuous rolling process, and can satisfy a requirement of a process for bond-packaging an LED by using an organic silicone resin photoconverter, thereby improving the production efficiency and yield of LED packages in industrialized batch production.

An equipment system for bond-packaging an LED using an organic silicone resin photoconverter by tandem rolling provided according to the present invention includes a protective film removing apparatus used for removing a protective film on one side of a photoconversion sheet with protective films on both sides and a roll-bonding apparatus for packaging a flip chip LED array by using the photoconversion sheet containing a protective film on a single side, to form LED package elements, where the protective film removing apparatus includes a photoconversion sheet freezing part, a traction part for pulling and removing a protective film on a single side of the frozen photoconversion sheet, and a photoconversion sheet rewarming part that are sequentially connected and disposed, and the roll-bonding apparatus includes two smooth-surface bonding single-wheeled rollers whose rolling surfaces are both smooth surfaces.

An implementation principle of the present invention is as follows: To better resolve problems in an existing process of packaging a flip chip LED, the present invention subtly designs an equipment system for bond-packaging an LED using an organic silicone resin photoconverter by tandem rolling. A principle of roll-bonding and packaging in the present invention lies in that: On one hand, rollers are used to roll a semi-cured organic silicone resin photoconversion sheet to produce a flow in sags and crests in the sheet, so as to eliminate possible residual pores, sags and crests, or other flaws produced during processing in the organic silicone resin photoconversion sheet, thereby obtaining a flat refined semi-cured organic silicone resin photoconversion sheet without pores and having a uniform thickness. On the other hand, after a pseudo-cured organic silicone resin photoconversion sheet is obtained by means of low-temperature freezing and a protective film is removed subsequently, a semi-cured photoconversion sheet containing no protective film is obtained by means of direct warming or/and illumination warming and is roll-bonded with a flip chip LED array sheet, thereby obtaining LED package elements. Furthermore, the present invention provides a continuous process flow, which can meet processing conditions of batch production of LED package elements and achieve completely consistent specifications and dimensions. In this way, the production efficiency of the LED package elements is enhanced, brightness and color uniformity of finished LED package elements is improved, and the yield is greatly improved.

The present invention has the following significant advantages in comparison with the prior art:

First, the equipment system provided in the present invention has a significant advantage of being applicable to a novel process of bond-packaging an LED using an organic silicone resin photoconverter by rolling, and solves the problems of low light emission efficiency, low production efficiency, and a low yield of bond-packaging using existing conventional processes such as a casting process, a screen printing process, an upper and lower flat plate molding process, a single-wheeled roller pressing process, and the like. Therefore, the present invention can meet a requirement of a continuous process flow of bond-packaging an LED by using an organic silicone resin fluorophor, thereby improving the production efficiency and yield of industrialized batch production of LED packages.

Second, the present invention provides an equipment system applicable to bond-packaging an LED by flow tandem rolling, so that possible residual pores, sags and crests, or other flaws produced during processing in the semi-cured organic silicone resin photoconversion sheet can be effectively eliminated, thus significantly improving brightness and color uniformity of finished LED package elements. The yield of LED package elements manufactured according to the present invention is significantly improved compared with the prior art.

Third, by means of the low-temperature freezing solution provided in the present invention, a pseudo-cured organic silicone resin photoconversion sheet is obtained first, and a protective film is removed subsequently. Next, a semi-cured organic silicone resin photoconversion sheet containing no protective film is obtained by means of direct warming or/and illumination warming and is roll-bonded with a flip chip LED array sheet, to obtain LED package elements, thereby desirably resolving a major problem in an existing conventional process that a protective film of a semi-cured organic silicone resin photoconversion sheet cannot be removed.

Fourth, the equipment system provided in the present invention is widely applicable to processes of bond-packaging flip chip LEDs with various power using an organic silicone resin photoconverter, so as to fully satisfy the requirement of refining a product production process during industrialized batch production of LED packages.

Meaning of numerals in the accompanying drawings of the present invention:

1-1 First roll-laminating single-wheeled roller of the roll-laminating apparatus.
1-2 Second roll-laminating single-wheeled roller of the roll-laminating apparatus.
1-3 Third roll-laminating single-wheeled roller of the roll-laminating apparatus.
1-4 Fourth roll-laminating single-wheeled roller of the roll-laminating apparatus.
1-5 First buffer roller
1-6 Second buffer roller
2-1 First freezing single-wheeled roller of the photoconversion sheet freezing part.
2-2 Second freezing single-wheeled roller of the photoconversion sheet freezing part.
3-1 First traction single-wheeled roller in a traction part for a protective film on a single side.
3-2 Second traction single-wheeled roller with clamping grooves in the traction part for a protective film on a single side.
4-1 First rewarming single-wheeled roller in the photoconversion sheet rewarming part.
4-2 Second rewarming single-wheeled roller in the photoconversion sheet rewarming part.
5-1 First smooth-surface bonding single-wheeled roller in the roll-bonding apparatus.
5-2 Second smooth-surface bonding single-wheeled roller in the roll-bonding apparatus.
5-3 flip chip LED.
5-4 Carrier film.
6 Curing apparatus.
7 Cutting apparatus.
8-1 Film-collecting roller.
8-2 Wind-up roller.
8-3 flip chip LED buffer roller.
9-1 Semi-curing slurry.
9-2 First protective film.
9-3 Second protective film.
9-4 Rough photoconversion sheet.
9-5 Refined photoconversion sheet.
9-6 Pseudo-cured photoconversion sheet.
9-7 Semi-cured photoconversion sheet having the first protective film.

DETAILED DESCRIPTION OF THE INVENTION

Specific implementations of the present invention are further described below in detail with reference to the accompanying drawings and embodiments.

Embodiment 1

Figure 1:
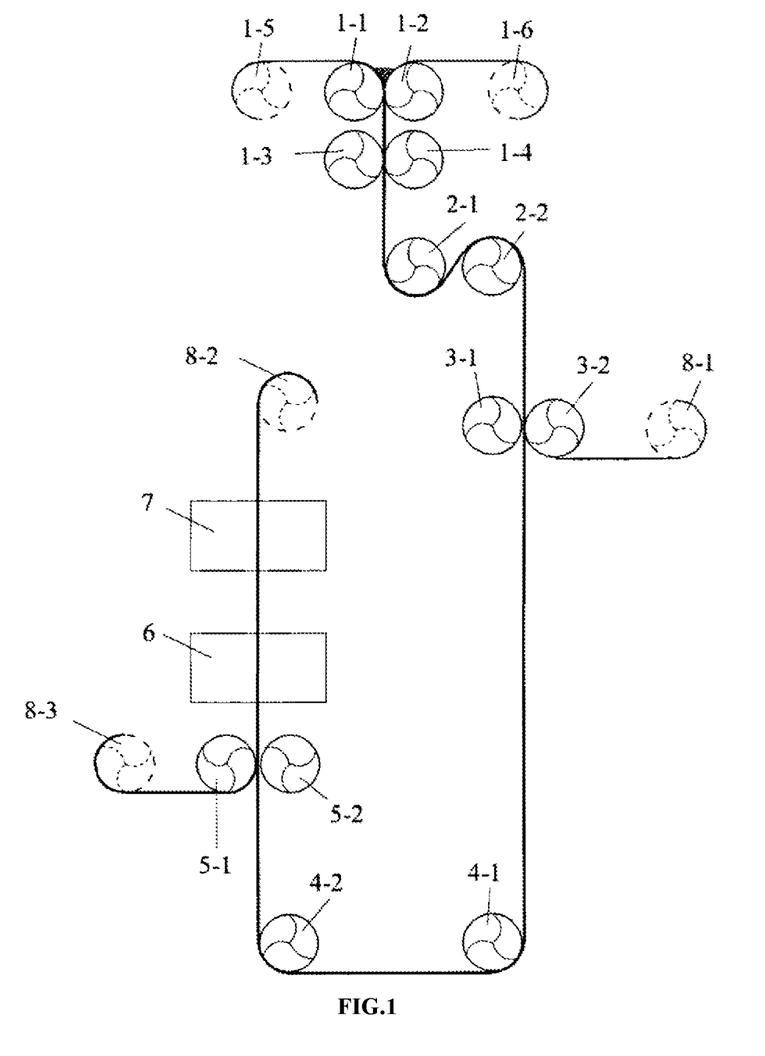
FIG. 1 is a schematic structural diagram of a flow layout of an equipment system for bond-packaging an LED using an organic silicone resin photoconverter by tandem rolling.

Referring to FIG. 1, an equipment system for bond-packaging an LED using an organic silicone resin photoconverter by tandem rolling provided in the present invention includes a protective film removing apparatus used for removing a protective film on one side of a photoconversion sheet with protective films on both sides and a roll-bonding apparatus for packaging a flip chip LED array by using the photoconversion sheet containing a protective film on a single side, to form LED package elements. The protective film removing apparatus includes a photoconversion sheet freezing part, a traction part for pulling and removing a protective film on a single side of a frozen photoconversion sheet, and a photoconversion sheet rewarming part that are sequentially connected and disposed. The roll-bonding apparatus includes two smooth-surface bonding single-wheeled rollers whose rolling surfaces are both smooth surfaces.

It should be particularly noted that:

Apparatuses, devices or parts of the steps involved in an equipment system for bond-packaging an LED using an organic silicone resin photoconverter by tandem rolling provided in the present invention may be picked out from the existing field of precision machine manufacturing with reference to the requirements of specific implementations in the present invention.

Further preferred solutions of the equipment system for bond-packaging an LED using an organic silicone resin photoconverter by tandem rolling provided in the present invention are as follows:

The photoconversion sheet freezing part is a freezing roller component, and the freezing roller component includes one or more freezing single-wheeled rollers with a roller temperature of −40° C. to −5° C. Preferably, the temperature of the single-wheeled roller is −10° C. to −20° C.

The photoconversion sheet freezing part is a temperature control device that includes a photoconversion sheet receiving port and a photoconversion sheet output port and sets an environmental temperature to −40° C. to −5° C. Preferably, the environmental temperature is −10° C. to −20° C.

Figure 3:
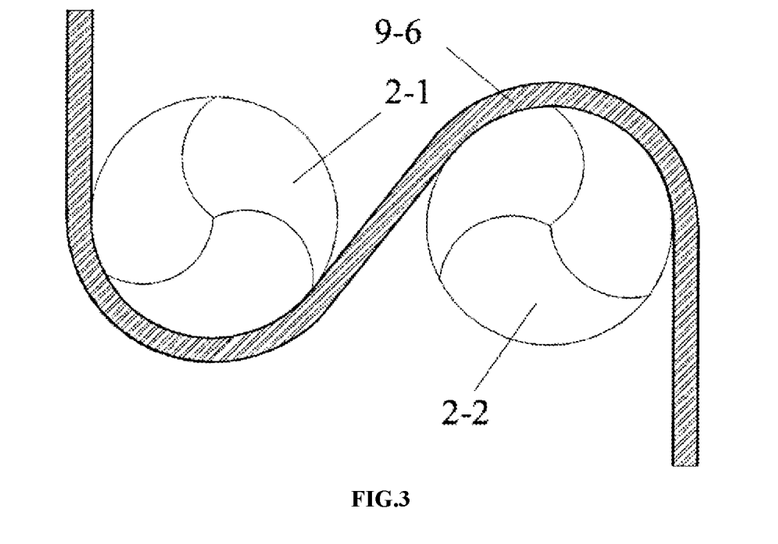
FIG. 3 is a schematic structural diagram of a photoconversion sheet freezing part shown in FIG. 1 according to the present invention.

It should be noted that, as shown in FIG. 3, the photoconversion sheet freezing part in the protective film removing apparatus includes a first freezing single-wheeled roller (2-1) and a second freezing single-wheeled roller (2-2) with a temperature of −5° C. to −40° C., and performs pseudo curing, to obtain a pseudo-cured photoconversion sheet (9-6).

The traction part for a protective film on a single side includes a traction single-wheeled roller with clamping grooves, and the clamping grooves are used to fix the protective film on the single side of the photoconversion sheet. Holes matching the clamping grooves of the traction single-wheeled roller with the clamping grooves are provided on two sides in a width direction of the protective film on the single side.

The protective film removing apparatus further includes a film collector.

Figure 4:
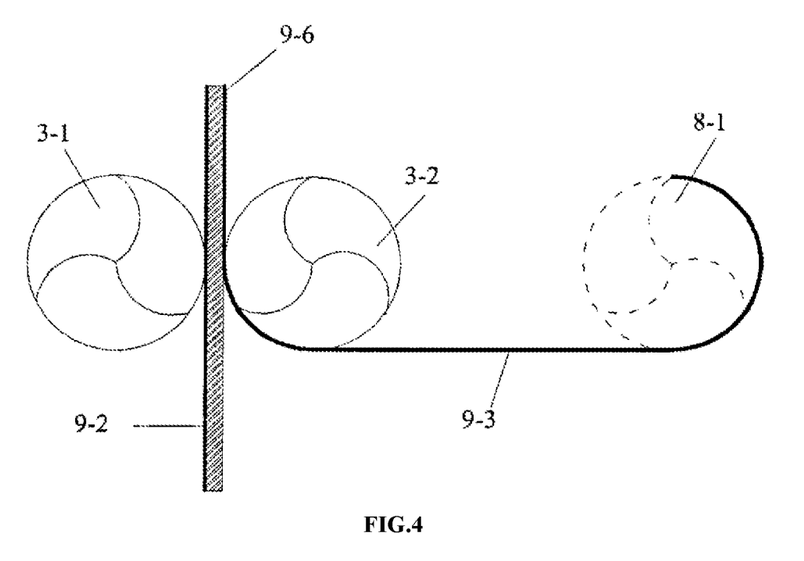
FIG. 4 is a schematic structural diagram of a protective film removing apparatus shown in FIG. 1 according to the present invention.

It should be noted that, as shown in FIG. 4, the traction part for a protective film on a single side includes a first traction single-wheeled roller (3-1) and a second traction single-wheeled roller (3-2) with clamping grooves, and removes a second protective film (9-3). The removed second protective film (9-3) is received in a film-collecting roller (8-1).

The photoconversion sheet rewarming part is a heating roller component. The heating roller component includes one or more rewarming single-wheeled rollers with a roller temperature of 50° C. to 120° C. Preferably, the temperature of the single-wheeled roller is 80° C. to 100° C.

The photoconversion sheet rewarming part is a temperature control device that is provided with a photoconversion sheet receiving port and a photoconversion sheet output port and sets an environmental temperature to 50° C. to 120° C. Preferably, the environmental temperature is 80° C. to 100° C.

Figure 5:
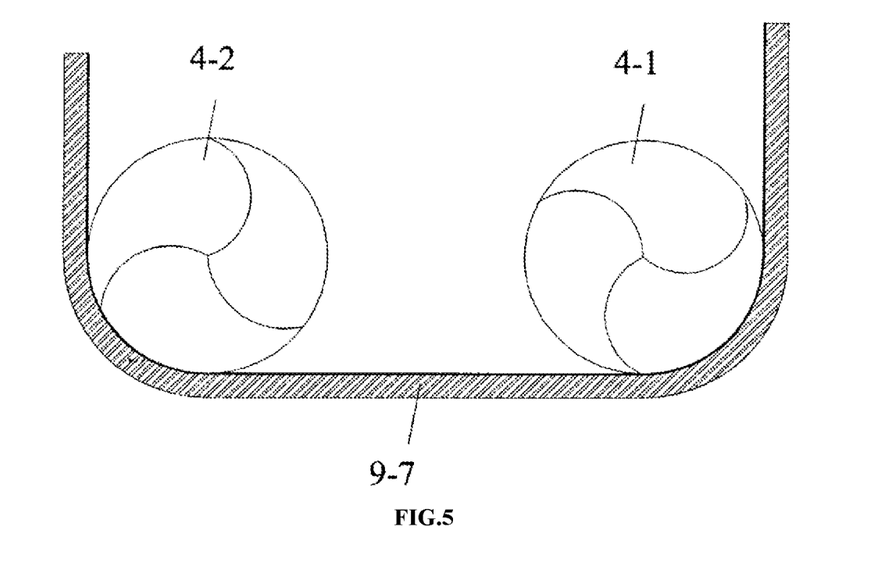
FIG. 5 is a schematic structural diagram of a photoconversion sheet rewarming part shown in FIG. 1 according to the present invention.

It should be noted that, as shown in FIG. 5, the photoconversion sheet rewarming part includes a first rewarming single-wheeled roller (4-1) and a second rewarming single-wheeled roller (4-2). The pseudo-cured photoconversion sheet is turned from a pseudo-cured state to a semi-cured state by means of warming, to obtain a semi-cured photoconversion sheet (9-7) with the second protective film removed.

Figure 6:
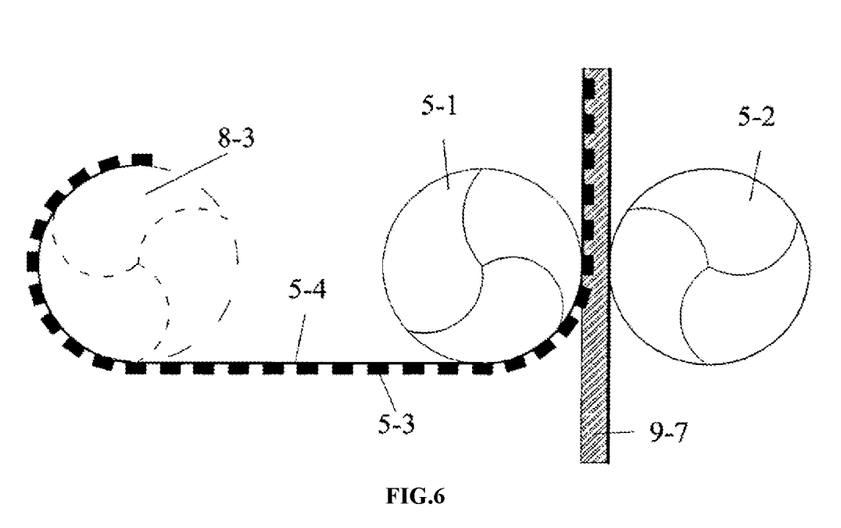
FIG. 6 is a schematic structural diagram of a roll-bonding apparatus shown in FIG. 1 according to the present invention.

The two smooth-surface bonding single-wheeled rollers whose rolling surfaces are both smooth surfaces in the roll-bonding apparatus refer to a smooth-surface bonding single-wheeled roller arranged with the photoconversion sheet and a smooth-surface bonding single-wheeled roller arranged with a flip chip LED array sheet, the single-wheeled rollers being disposed face-to-face in alignment with each other. It should be noted that, as shown in FIG. 6, the roll-bonding apparatus includes a first smooth-surface bonding single-wheeled roller (5-1) and a second smooth-surface bonding single-wheeled roller (5-2) that perform rolling face-to-face in alignment with each other. The semi-cured photoconversion sheet (9-7) with the second protective film removed and the flip chip LED array sheet pass through the roll-bonding apparatus, such that the flip chip LEDs in the flip chip LED array are bonded to and inserted in the semi-cured photoconversion sheet (9-7), to obtain LED package elements.

A displacement adjusting apparatus for adjusting a roller interval between the single-wheeled roller arranged with the photoconversion sheet and the single-wheeled roller arranged with the flip chip LED array sheet is provided for the two single-wheeled rollers whose rolling surfaces are both smooth surfaces.

Radial run-out distances of the single-wheeled roller arranged with the photoconversion sheet and the single-wheeled roller arranged with the flip chip LED array sheet are both less than or equal to 2 μm.

The equipment system further includes a roll-laminating apparatus used for manufacturing the photoconversion sheet. The roll-laminating apparatus is a process apparatus located at a front end of the protective film removing apparatus. The roll-laminating apparatus is one or more smooth-surface dual-roller rolling apparatuses, and the smooth-surface dual-roller rolling apparatus includes dual rollers. A displacement adjusting apparatus for adjusting an interval between rollers is provided for the dual rollers. A radial run-out distance of each of the dual rollers is less than or equal to 2 μm.

Figure 2:
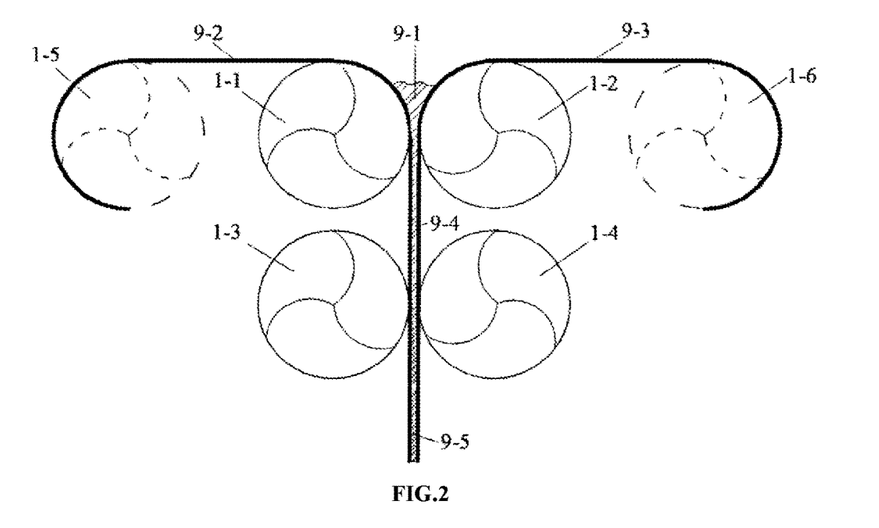
FIG. 2 is a schematic structural diagram of a roll-laminating apparatus used for manufacturing a photoconversion sheet shown in FIG. 1 according to the present invention.

It should be noted that, as shown in FIG. 2, the roll-laminating apparatus includes two smooth-surface dual-roller rolling apparatuses. The smooth-surface dual-roller rolling apparatus includes two groups of dual rollers: a first roll-laminating single-wheeled roller (1-1) and a second roll-laminating single-wheeled roller (1-2), and a third roll-laminating single-wheeled roller (1-3) and a fourth roll-laminating single-wheeled roller (1-4). A first protective film (9-2), a semi-curing slurry (9-1), and the second protective film (9-3) are rolled by using the roll-laminating single-wheeled roller (1-1) and the second roll-laminating single-wheeled roller (1-2), to obtain a rough photoconversion sheet (9-4). The rough photoconversion sheet (9-4) is then rolled by using the third roll-laminating single-wheeled roller (1-3) and the fourth roll-laminating single-wheeled roller (1-4), to obtain a refined photoconversion sheet (9-5).

The equipment system further includes a curing apparatus, and the curing apparatus is a process apparatus located at a rear end of the roll-bonding apparatus.

The curing apparatus is a tunnel-type temperature control apparatus or a tunnel-type illumination apparatus. The tunnel-type temperature control apparatus includes a heating part, a temperature regulation part, and a conveyor belt passage. The tunnel-type illumination apparatus includes an illumination part, a light intensity regulation part, and a conveyor belt passage.

The equipment system further includes a cutting apparatus for cutting the cured LED package elements, and the cutting apparatus is process equipment disposed at a rear end of the curing apparatus.

The cutting apparatus is a roll cutting apparatus. The roll cutting apparatus includes a first roll-cutting rolling component with an arrayed cutter and a smooth-surface second roll-cutting rolling component that are disposed face-to-face in alignment with each other.

The first roll-cutting rolling component with an arrayed cutter in the roll cutting apparatus is first roll-cutting single-wheeled roller with an arrayed cutter or a first roll-cutting planar conveyor with an arrayed cutter. The smooth-surface second roll-cutting rolling component is a smooth-surface second roll-cutting single-wheeled roller or a smooth-surface second roll-cutting planar conveyor. At least one of the first roll-cutting rolling component with an arrayed cutter and the smooth-surface second roll-cutting rolling component is a single-wheeled roller. The arrayed cutter is a cutter having an array of rectangular grids. Dimensions of the rectangular grid are the same as those of an individual LED package element.

A displacement adjusting apparatus for adjusting an interval between the first roll-cutting rolling component with an arrayed cutter and the smooth-surface second roll-cutting rolling component is provided for the roll cutting apparatus.

Any one of the first roll-cutting rolling component with an arrayed cutter and the smooth-surface second roll-cutting rolling component that is a single-wheeled roller has a radial run-out distance less than or equal to 2 μm.

The equipment system for bond-packaging an LED using an organic silicone resin photoconverter by tandem rolling provided in the present invention is widely applicable to various new processes of bond-packaging flip chip LEDs with various power using an organic silicone resin photoconverter.

In Embodiment 2 below, the present invention is applied to a new process of bond-packaging an LED using an organic silicone resin photoconverter by tandem rolling, and specific implementations of Embodiment 2 of the present invention are further describe in detail.

Embodiment 2

A process for bond-packaging an LED using an organic silicone resin photoconverter by tandem rolling, to which the equipment system in the present invention is applied, includes the following continuous process flow: preparation of a semi-cured photoconversion sheet, pseudo-curing of the semi-cured photoconversion sheet, preparation of a flip chip LED array sheet, forming of LED package elements by dual-roller roll-bonding, curing of the LED package elements, and cutting of the LED package elements. The process specifically includes the following steps:

step 1: preparation of a semi-cured photoconversion sheet: obtaining the semi-cured photoconversion sheet formed of a first protective film, a semi-cured photoconversion film, and a second protective film, where the semi-cured photoconversion film includes semi-cured organic silicone resin and a photoconversion material;

step 2: pseudo-curing of the semi-cured photoconversion sheet: in a vacuum condition, by means of low-temperature freezing, pseudo-curing the semi-cured photoconversion sheet obtained in step 1, to obtain a pseudo-cured photoconversion sheet;

step 3: preparation of a flip chip LED array sheet: obtaining the flip chip LED array sheet, flip chip LEDs in the flip chip LED array sheet being arranged on a carrier film in an array manner, where the flip chip LEDs being arranged in an array manner means arrangement in an array by using an individual LEDflip chip LED as a unit or arrangement in an array by using a flip chip LED component as a unit, and the flip chip LED component is formed of two or more individual flip chip LEDs;

step 4: forming of LED package elements by dual-roller roll-bonding: in a vacuum condition, removing the second protective film of the pseudo-cured photoconversion sheet in step 2, to obtain the pseudo-cured photoconversion sheet containing no protective film on a single side, then enabling the pseudo-cured photoconversion sheet to turn from a pseudo-cured state to a semi-cured state by means of heating or/and illumination, and subsequently performing dual-roller roll-bonding on the semi-cured photoconversion sheet and the flip chip LED array sheet, such that the flip chip LEDs in the flip chip LED array are bonded to and inserted in the photoconversion sheet, to obtain the LED package elements;

step 5: curing of the LED package elements: in a vacuum condition, curing the LED package elements by means or heat curing or/and photocuring, to obtain the cured LED package elements; and step 6: cutting of the LED package elements: removing the first protective film of the cured LED package elements in step 5, and cutting the cured LED package elements, to obtain finished LED package elements having slits for splitting into individual LED package elements.

Specific implementation solutions of the process for bond-packaging an LED using an organic silicone resin photoconverter by tandem rolling, to which the equipment system in the present invention is applied, are further disclosed as follows:

The preparation of a semi-cured photoconversion sheet in step 1 means: in a vacuum condition, as shown in FIG. 2, laminating the first protective film, the semi-cured photoconversion film, and the second protective film with a mixed semi-cured slurry that at least includes the organic silicone resin and the photoconversion material, and then performing roll-forming using a single group or multiple groups of dual rollers, to obtain the semi-cured photoconversion sheet that is formed of the first protective film, the semi-cured photoconversion film, and the second protective film. The photoconversion material is quantum dot fluorophor or fluorophor powder. In the roll-forming using a single group or multiple groups of dual rollers in step 1: the roll-forming using a single group of dual rollers means that the first protective film, the mixed semi-curing slurry that includes the organic silicone resin and the photoconversion material, and the second protective film are roll-formed by using a single smooth-surface dual-roller rolling apparatus. The roll-forming using multiple groups of dual rollers means that the first protective film, the mixed semi-curing slurry that includes the organic silicone resin and the photoconversion material, and the second protective film are roll-formed by using one smooth-surface dual-roller rolling apparatus, to obtain a rough semi-cured photoconversion sheet, and the obtained rough semi-cured photoconversion sheet is then roll-formed by using one, two or more smooth-surface dual-roller rolling apparatuses, to obtain the refined semi-cured photoconversion sheet. A thickness of the rough photoconversion sheet is within 850 μm. Optimally, the thickness of the rough photoconversion sheet is 150 μm to 300 μm. A thickness of the refined photoconversion sheet is within 800 Optimally, the thickness of the refined photoconversion sheet is 150 μm to 250 μm. A material of the first protective film and the second protective film is polyester, polyolefin or polyether. A temperature in the roll-forming using a single group or multiple groups of dual rollers is 50° C. to 120° C. Optimally, the temperature in the roll-forming is 80° C. to 100° C.

A temperature in the low-temperature freezing in step 2 is −5° C. to −40° C. Preferably, the temperature of freezing is −10° C. to −20° C. The pseudo-cured photoconversion sheet means that the semi-cured photoconversion sheet obtained in step 1 is only physically hardened. Referring to FIG. 3, in step 2, the photoconversion sheet obtained in step 1 is pseudo-cured by using a first freezing single-wheeled roller (2-1) and a second freezing single-wheeled roller (2-2) of a freezing part with a temperature of −5° C. to −40° C., to obtain a pseudo-cured photoconversion sheet (9-6).

The carrier film in step 3 is a stretchable carrier film, and a material of the stretchable carrier film is high-temperature resistant polyester, polydimethylsiloxane or polyvinyl chloride.

A temperature in the enabling the pseudo-cured photoconversion sheet to turn from a pseudo-cured state to a semi-cured state by means of heating or/and illumination in step 4 is 50° C. to 120° C. Preferably, the temperature is 80° C. to 100° C.

In step 4, a bonding temperature in the forming by dual-roller roll-bonding is 50° C. to 120° C. Optimally, the temperature in the forming by bonding is 80° C. to 100° C.

It should be noted that:

Referring to FIG. 4, in step 4, for the pseudo-cured photoconversion sheet (9-6) obtained in step 2, the second protective film (9-3) is first removed by using a first traction single-wheeled roller (3-1) and a second traction single-wheeled roller (3-2). The removed second protective film (9-3) is received in a film-collecting roller (8-1).

Referring to FIG. 5, in step 4, after the second protective film (9-3) is removed from the pseudo-cured photoconversion sheet (9-6), the pseudo-cured photoconversion sheet is then turned from a pseudo-cured state to a semi-cured state by means of warming using a first rewarming single-wheeled roller (4-1) and a second rewarming single-wheeled roller (4-2), to obtain a semi-cured photoconversion sheet (9-7) with second protective film removed.

Referring to FIG. 6, in step 4, the semi-cured photoconversion sheet (9-7) with the second protective film removed and the flip chip LED array sheet obtained in step 3 are rolled face-to-face in alignment with each other by using a first smooth-surface bonding single-wheeled roller (5-1) and a second smooth-surface bonding single-wheeled roller (5-2), such that the flip chip LEDs in the flip chip LED array to be bonded to and inserted in the semi-cured photoconversion sheet (9-7), to obtain the LED package elements.

The photocuring in step 5 is curing with active energy ray. In the heat curing in step 5, a curing temperature is 140° C. to 180° C., and a curing time is greater than or equal to 1 h. Optimally, the curing temperature is 150° C. to 160° C., and the curing time is 2 h.

Step 6 of cutting the cured LED package elements means performing roll-cutting on the cured LED package elements by using an apparatus that includes a first roll-cutting rolling component with an arrayed cutter and a smooth-surface second roll-cutting rolling component, to obtain the finished LED package elements having slits for splitting into individual LED package elements. The first roll-cutting rolling component with an arrayed cutter is a first roll-cutting single-wheeled roller with an arrayed cutter or a first roll-cutting planar conveyor with an arrayed cutter, the smooth-surface second roll-cutting rolling component is a smooth-surface second roll-cutting single-wheeled roller or a smooth-surface second roll-cutting planar conveyor, and at least one of the first roll-cutting rolling component with an arrayed cutter and the smooth-surface second roll-cutting rolling component is a single-wheeled roller. The arrayed cutter in the first roll-cutting rolling component with an arrayed cutter is a cutter with an array of rectangular grids, where dimensions of the rectangular grid are the same as those of a single finished LED package element. An interval between single-wheeled rollers or between a single-wheeled roller and a planar conveyor does exceed a thickness of the carrier film in the flip chip LED array sheet. A width of the slit is within 20 μm.

According to a requirement, the carrier film of the finished LED package elements in step 6 may then be stretched by using a stretcher, such that the finished LED package elements are split along the slits after being stretched, to obtain single finished LED package elements.

Any description not involved in the specific implementations of the present invention belongs to well-known technologies in the art and can be implemented with reference to the well-known technologies.

The present invention gains a satisfactory trial result after repeated test and verification.

The foregoing specific implementations and embodiments give a specific support for a technical idea of an equipment system for bond-packaging an LED using an organic silicone resin photoconverter by tandem rolling according to the present invention, and are not intended to limit the protection scope of the present invention. Any equivalent changes or modifications made on the basis of the technical solutions according to the technical idea proposed in the present invention still fall within the protection scope of the technical solutions of the present invention.

What is claimed is:

1. An equipment system for bond-packaging an LED using an organic silicone resin photoconverter by tandem rolling, comprising a protective film removing apparatus used for removing a protective film on one side of a photoconversion sheet with protective films on both sides and a roll-bonding apparatus for packaging a flip chip LED array by using the photoconversion sheet containing a protective film on a single side, to form LED package elements, wherein the protective film removing apparatus comprises a photoconversion sheet freezing part, a traction part for pulling and removing a protective film on a single side of a frozen photoconversion sheet, and a photoconversion sheet rewarming part that are sequentially connected and disposed, and the roll-bonding apparatus comprises two bonding single-wheeled rollers.

2. The equipment system for bond-packaging an LED using an organic silicone resin photoconverter by tandem rolling according to claim 1, wherein the photoconversion sheet freezing part is a freezing roller component, and the freezing roller component comprises one or more freezing single-wheeled rollers with a roller temperature of −40° C. to −5° C.; or the photoconversion sheet freezing part is a temperature control device that comprises a photoconversion sheet receiving port and a photoconversion sheet output port and sets an environmental temperature to −40° C. to −5° C.

3. The equipment system for bond-packaging an LED using an organic silicone resin photoconverter by tandem rolling according to claim 1, wherein the traction part comprises a traction single-wheeled roller with clamping grooves, and the clamping grooves are used to fix the protective film on the single side of the photoconversion sheet.

4. The equipment system for bond-packaging an LED using an organic silicone resin photoconverter by tandem rolling according to claim 1, wherein the photoconversion sheet rewarming part is a heating roller component, and the heating roller component comprises one or more rewarming single-wheeled rollers with a roller temperature of 50° C. to 120° C.; or the photoconversion sheet rewarming part is a temperature control device that is provided with a photoconversion sheet receiving port and a photoconversion sheet output port and sets an environmental temperature to 50° C. to 120° C.

5. The equipment system for bond-packaging an LED using an organic silicone resin photoconverter by tandem rolling according to claim 1, wherein the two bonding single-wheeled rollers in the roll-bonding apparatus comprise a first bonding single-wheeled roller arranged with the photoconversion sheet and a second bonding single-wheeled roller arranged with a flip chip LED array sheet, the first and second single-wheeled rollers being disposed face-to-face in alignment with each other.

6. The equipment system for bond-packaging an LED using an organic silicone resin photoconverter by tandem rolling according to claim 5, wherein a displacement adjusting apparatus for adjusting a roller interval between the single-wheeled roller arranged with the photoconversion sheet and the single-wheeled roller arranged with the flip chip LED array sheet is provided for the two bonding single-wheeled rollers whose rolling surfaces are both smooth surfaces; and radial run-out distances of the first bonding single-wheeled roller arranged with the photoconversion sheet and the second bonding single-wheeled roller arranged with the flip chip LED array sheet are both less than or equal to 2 μm.

7. The equipment system for bond-packaging an LED using an organic silicone resin photoconverter by tandem rolling according to claim 1, wherein the equipment system further comprises a roll-laminating apparatus used for manufacturing the photoconversion sheet; the roll-laminating apparatus is a process apparatus located at a front end of the protective film removing apparatus; the roll-laminating apparatus is one or more dual-roller rolling apparatuses, and wherein each dual-roller rolling apparatus comprises dual rollers; a displacement adjusting apparatus for adjusting an interval between rollers is provided for the dual rollers; and a radial run-out distance of each of the dual rollers is less than or equal to 2 μm.

8. The equipment system for bond-packaging an LED using an organic silicone resin photoconverter by tandem rolling according to claim 7, wherein the equipment system further comprises a curing apparatus, and the curing apparatus is a process apparatus located at a rear end of the roll-bonding apparatus.

9. The equipment system for bond-packaging an LED using an organic silicone resin photoconverter by tandem rolling according to claim 8, wherein the curing apparatus is a tunnel-type temperature control apparatus or a tunnel-type illumination apparatus; the tunnel-type temperature control apparatus comprises a heating part, a temperature regulation part, and a conveyor belt passage; and the tunnel-type illumination apparatus comprises an illumination part, a light intensity regulation part, and a conveyor belt passage.

10. The equipment system for bond-packaging an LED using an organic silicone resin photoconverter by tandem rolling according to claim 8, wherein the equipment system further comprises a cutting apparatus for cutting cured LED package elements, and the cutting apparatus is process equipment disposed at a rear end of the curing apparatus.

11. The equipment system for bond-packaging an LED using an organic silicone resin photoconverter by tandem rolling according to claim 10, wherein the cutting apparatus is a roll cutting apparatus, and the roll cutting apparatus comprises a first roll-cutting rolling component with an arrayed cutter and a second roll-cutting rolling component that are disposed face-to-face in alignment with each other; and the first roll-cutting rolling component with an arrayed cutter in the roll cutting apparatus is a first roll-cutting single-wheeled roller with an arrayed cutter or a first roll-cutting planar conveyor with an arrayed cutter; the second roll-cutting rolling component is a second roll-cutting single-wheeled roller or a second roll-cutting planar conveyor; at least one of the first roll-cutting rolling component with an arrayed cutter and the second roll-cutting rolling component is a single-wheeled roller; and the arrayed cutter is a cutter having an array of rectangular grids.

12. The equipment system for bond-packaging an LED using an organic silicone resin photoconverter by tandem rolling according to claim 11, wherein the roll cutting apparatus is provided with a displacement adjusting apparatus for adjusting an interval between the first roll-cutting rolling component with an arrayed cutter and the second roll-cutting rolling component; and any one of the first roll-cutting rolling component with an arrayed cutter and the second roll-cutting rolling component that is a single-wheeled roller has a radial run-out distance less than or equal to 2 μm.

13. The equipment system for bond-packaging an LED using an organic silicone resin photoconverter by tandem rolling according to claim 10, wherein the roll-laminating apparatus, the protective film removing apparatus, the roll-bonding apparatus, the curing apparatus, and the cutting apparatus of the equipment system are sequentially coordinated and linked, to form continuous flow process equipment.

* * * * *